(12) United States Patent
Chang Chien et al.

(10) Patent No.: US 12,154,863 B2
(45) Date of Patent: Nov. 26, 2024

(54) FAN-OUT SEMICONDUCTOR PACKAGE AND METHOD FOR MANUFACTURING THE SAME

(71) Applicant: Powertech Technology Inc., Hsinchu (TW)

(72) Inventors: Shang-Yu Chang Chien, Hsinchu (TW); Nan-Chun Lin, Hsinchu (TW); Hung-Hsin Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 420 days.

(21) Appl. No.: 17/454,742

(22) Filed: Nov. 12, 2021

(65) Prior Publication Data

US 2022/0328422 A1 Oct. 13, 2022

(30) Foreign Application Priority Data

Apr. 13, 2021 (TW) .................................. 110113272

(51) Int. Cl.
*H01L 23/552* (2006.01)
*H01L 21/56* (2006.01)
*H01L 21/762* (2006.01)
*H01L 23/66* (2006.01)
*H01Q 1/22* (2006.01)

(52) U.S. Cl.
CPC ............ *H01L 23/552* (2013.01); *H01L 21/56* (2013.01); *H01L 21/762* (2013.01); *H01L 23/66* (2013.01); *H01Q 1/2283* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 2013/0292808 A1* | 11/2013 | Yen | H01L 23/49805 257/E23.114 |
| 2020/0035625 A1* | 1/2020 | Wang | H01L 23/552 |
| 2020/0273771 A1* | 8/2020 | Choi | H01L 23/49575 |
| 2022/0051996 A1* | 2/2022 | Lee | H01L 23/5383 |

OTHER PUBLICATIONS

Search Report appended to an Office Action, which was issued to Taiwanese counterpart application No. 110113272 by the TIPO on Jun. 29, 2021, with an English translation thereof.

* cited by examiner

*Primary Examiner* — Jay C Chang
(74) *Attorney, Agent, or Firm* — Burris Law, PLLC

(57) ABSTRACT

A fan-out semiconductor package includes: a redistribution structure; a functional chip coupled to the redistribution structure; an isolation structure disposed on the redistribution structure and including a body formed with through-holes; a shielding structure disposed on the isolation structure and the redistribution structure; a first conductive pattern structure disposed on the isolation structure and extending through the through-holes of the isolation structure; an encapsulating structure disposed on the isolation structure, the shielding structure and the first conductive pattern structure; and a second conductive pattern structure disposed on the encapsulating structure. A method for manufacturing the fan-out semiconductor package is also disclosed.

12 Claims, 5 Drawing Sheets

FAN-OUT SEMICONDUCTOR PACKAGE AND METHOD FOR MANUFACTURING THE SAME

CROSS-REFERENCE TO RELATED APPLICATION

This application claims priority of Taiwanese Invention Patent Application No. 110113272, filed on Apr. 13, 2021.

FIELD

The disclosure relates to a semiconductor package, and more particularly to a fan-out semiconductor package and a method for manufacturing the same.

BACKGROUND

With the evolution of fifth-generation (5G) communication technology, development trend of 5G communication products focuses on the performance of an integrated circuit in signal processing.

Bandwidths of high demand 5G communication are about 28 GHz and about 60 GHz, which are very different from the current communication bandwidths. Thus, integrated circuit design and layout of 5G communication products with such bandwidths will be much more complicated. Furthermore, when extension requirements of other electronic components including an antenna that might be integrated with the integrated circuit are put into consideration, packaging process of the 5G electronic products would become more complicated.

Additionally, signals processed in 5G communication are millimeter waves, which are more susceptible to interference from environmental noise and electromagnetic radiation. A current approach is to dispose a shielding component outside an electronic package, where the integrated circuit is packaged, so as to reduce the interference. However, such approach is difficult to meet the requirement of miniaturization after integration with other electronic components, and also makes the packaging process more complicated. Hence, there is still room for improvement in packaging of 5G communication product with reduced complexity.

SUMMARY

Therefore, an object of the disclosure is to provide a fan-out semiconductor package that can alleviate or eliminate at least one of the drawbacks of the prior art.

According to an aspect of the disclosure, a fan-out semiconductor package includes: a redistribution structure for external electrical connection; a functional chip that is electrically coupled to the redistribution structure; an isolation structure that is disposed on the redistribution structure and that includes a body formed with a plurality of through-holes to expose the redistribution structure; a shielding structure that is disposed on the isolation structure and the redistribution structure so as to cooperate with the redistribution structure to enclose the functional chip; a first conductive pattern structure that is disposed on the isolation structure and that extends through the through-holes of the isolation structure to be electrically connected to the redistribution structure; an encapsulating structure that is disposed on the isolation structure, the shielding structure and the first conductive pattern structure so as to cooperate with the redistribution structure to enclose the isolation structure, the functional chip, the shielding structure and the first conductive pattern structure; and a second conductive pattern structure that is disposed on the encapsulating structure.

According to an another aspect of the disclosure, a method for manufacturing a fan-out semiconductor package includes: disposing at least one functional chip on a redistribution structure having a redistribution layer, the functional chip being electrically connected to the redistribution layer; forming an isolation structure having a body on the redistribution structure to cover the functional chip; patterning the isolation structure to form in the body an opening that is spaced apart from the functional chip and that surrounds the functional chip, and a plurality of through-holes to expose the redistribution layer; forming a conductive element on a top of the body of the isolation structure, in the opening, and in the through-holes; forming a bottom layer of an encapsulating structure on the conductive elements; forming a second conductive pattern structure on the bottom layer of the encapsulating structure; and forming a top layer of the encapsulating structure on the second conductive pattern structure.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
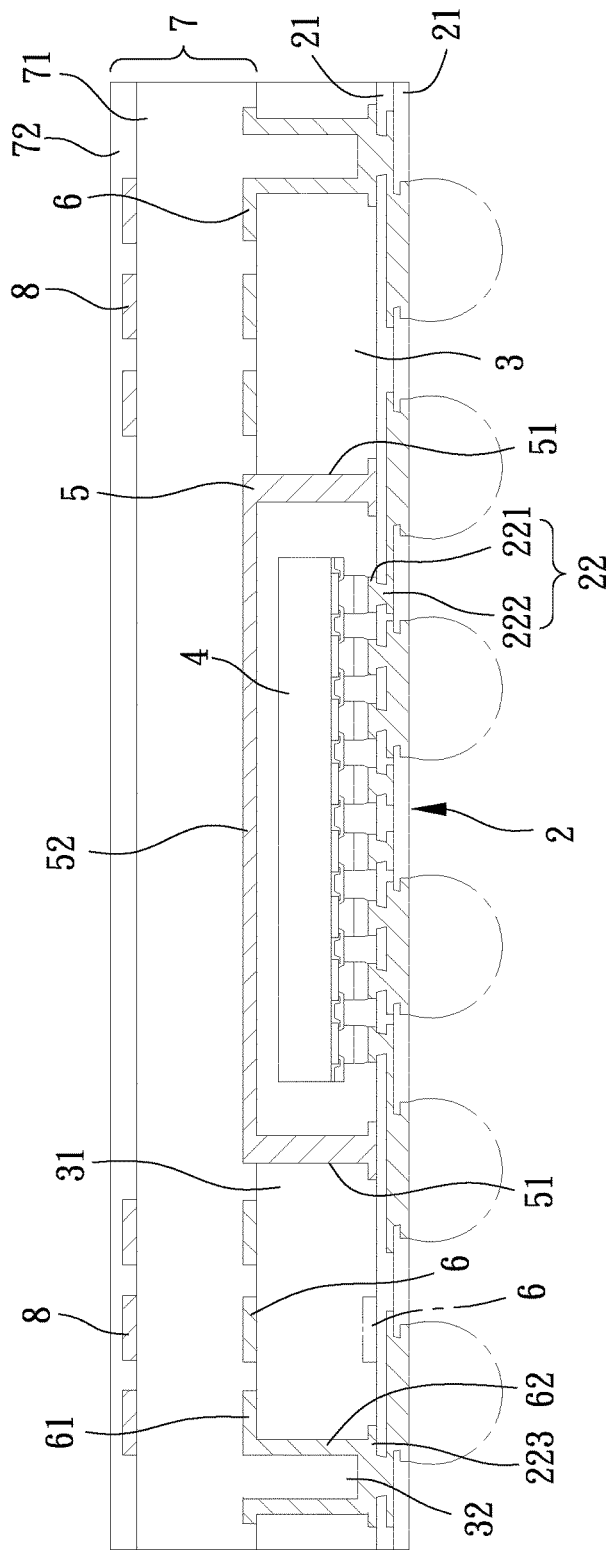
FIG. 1 is a cross-sectional view illustrating an embodiment of a fan-out semiconductor package of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a fan-out semiconductor package in accordance with an embodiment of the disclosure includes a redistribution structure 2, an isolation structure 3, a functional chip 4, a shielding structure 5, a first conductive pattern structure 6, an encapsulating structure 7, and a second conductive pattern structure 8.

The redistribution structure 2 is used for external electrical connection, and includes a dielectric layer 21 and a redistribution layer 22 disposed on the dielectric layer 21. The dielectric layer 21 is made of a dielectric material, such as polyimide (PI), but is not limited thereto. The redistribution layer 22 is made of a conductive material, and has first and second sides opposite to each other to be electrically connected to the functional chip 4 and the external electrical connection, respectively. To be specific, the redistribution layer 22 has a chip-bonding pad 221 and a redistribution portion 222 connected to the chip-bonding pad 221. The chip-bonding pad 221 defines the first side, and protrudes out from a top of the dielectric layer 21 for flipping and connecting the functional chip 4 thereto. The redistribution portion 222 defines the second side, is connected to the chip-bonding pad 221, and is embedded in the dielectric layer 21. The redistribution portion 222 is connected to the external electrical connection via a plurality of solder balls, so that the redistribution layer 22 serves as an interface between the functional chip 4 and the external electrical connection and so that a fan-out layout of integrated circuits is achievable. The chip-bonding pad 221 may be formed by film deposition or electroplating combined with photolithography. In this embodiment, the chip-bonding pad 221 may be formed before the functional chip 4 is electrically connected to the chip-bonding pad 221 using flip chip bonding techniques. In some embodiments, the redistribution layer 22 further has a first conductive pattern bonding pad 223 that defines the first side of the redistribution layer 22, and protrudes out from a top of the dielectric layer 21 for the first conductive pattern 6 to be electrically connected thereto. The first conductive pattern bonding pad 223 may be formed along with the formation of the chip-bonding pad 221.

The isolation structure 3 is disposed on the redistribution structure 2, and includes a body 31 that is disposed on the dielectric layer 21 of the redistribution structure 2 to cover the functional chip 4 and that is formed with a plurality of through-holes 32 to expose the redistribution layer 22 of the redistribution structure 2.

The functional chip 4 is electrically coupled to the redistribution structure 2. To be specific, the functional chip 4 is flip-chip bonded to the chip-bonding pad 221 of the redistribution layer 22 of the redistribution structure 2, and is disposed in the body 31 of the isolation structure 3. The functional chip 4 may be used for processing millimeter wave signal in 5G mobile networks.

The shielding structure 5 is disposed on the isolation structure 3 and the redistribution structure 2 so as to cooperate with the redistribution structure 2 to enclose the functional chip 4. The shielding structure 5 is made of a conductive material, and includes a surrounding wall 51 that is disposed in the body 31 of the isolation structure 3 and that surrounds the functional chip 4, and a capping portion 52 that is connected to the surrounding wall 51 and that is disposed on a top of the body 31 of the isolation structure 3. The surrounding wall 51 and the capping portion 52 cooperatively define an inner space for receiving the functional chip 4. Since the functional chip 4 may be used for processing millimeter wave signal, the fan-out semiconductor package is required to be designed to prevent the functional chip 4 from interference from environmental noise and electromagnetic radiation. Hence, by having the surrounding wall 51 and the capping portion 52, the functional chip 4 is shielded from noise interference and electromagnetic radiation.

The first conductive pattern structure 6 is disposed on the isolation structure 3, and extends through the through-holes 32 of the isolation structure 3 to be electrically connected to the redistribution layer 22 of the redistribution structure 2. The first conductive structure 6 includes an antenna pattern 61 that is disposed on the top of the body 31 of the isolation structure 3, and a conductive feature 62 that is electrically connected to the antenna pattern 61 and that extends along a sidewall of each of the through-holes 32 to be electrically connected to the redistribution layer 22. The first conductive pattern structure 6 may be formed by a wet process (e.g., electroplating) combined with photolithography, so that the conductive feature 62 may be conformally disposed on the sidewall of each of the through-holes 32 instead of being conventionally formed as a solid metallic pillar. The problems of difficulty in control and high cost due to formation of the solid metallic pillar for electrical connection of circuits in different metal layers can be avoided. Furthermore, owing to the functional chip 4 being shielded by the shielding structure 5, the flexibility of designing the first conductive pattern structure 6 outside the shielding structure 5 is enhanced. The first conductive pattern structure 6 may be designed and adjusted based on actual specifications of the fan-out semiconductor package of this disclosure or may have a more complex layout.

The encapsulating structure 7 is disposed on the isolation structure 3, the shielding structure 5 and the first conductive pattern structure 6 so as to cooperate with the redistribution structure 2 to enclose the isolation structure 3, the functional chip 4, the shielding structure 5 and the first conductive pattern structure 6. The encapsulating structure 7 includes a bottom layer 71 covering the isolation structure 3, the shielding structure 5 and the first conductive pattern structure 6, and a top layer 72 disposed on the bottom layer 71 opposite to the redistribution structure 2.

The second conductive pattern structure 8 is disposed on the encapsulating structure 7. To be specific, the second conductive pattern structure 8 is disposed between the bottom layer 71 and the top layer 72. The second conductive pattern structure 8 and the antenna pattern 61 are coupled to form an antenna system that is capable of transmitting and receiving signals, so that the fan-out semiconductor package can be in communication with other electronic devices. Due to the functional chip 4 being shielded by the shielding structure 5, the flexibility of designing the second conductive pattern structure 8 outside the shielding structure 5 is also improved. Therefore, when the second conductive pattern structure 8 and the antenna pattern 61 are coupled to form the antenna system, it is easier to meet bandwidth requirements of the fan-out semiconductor package.

Figure 2:
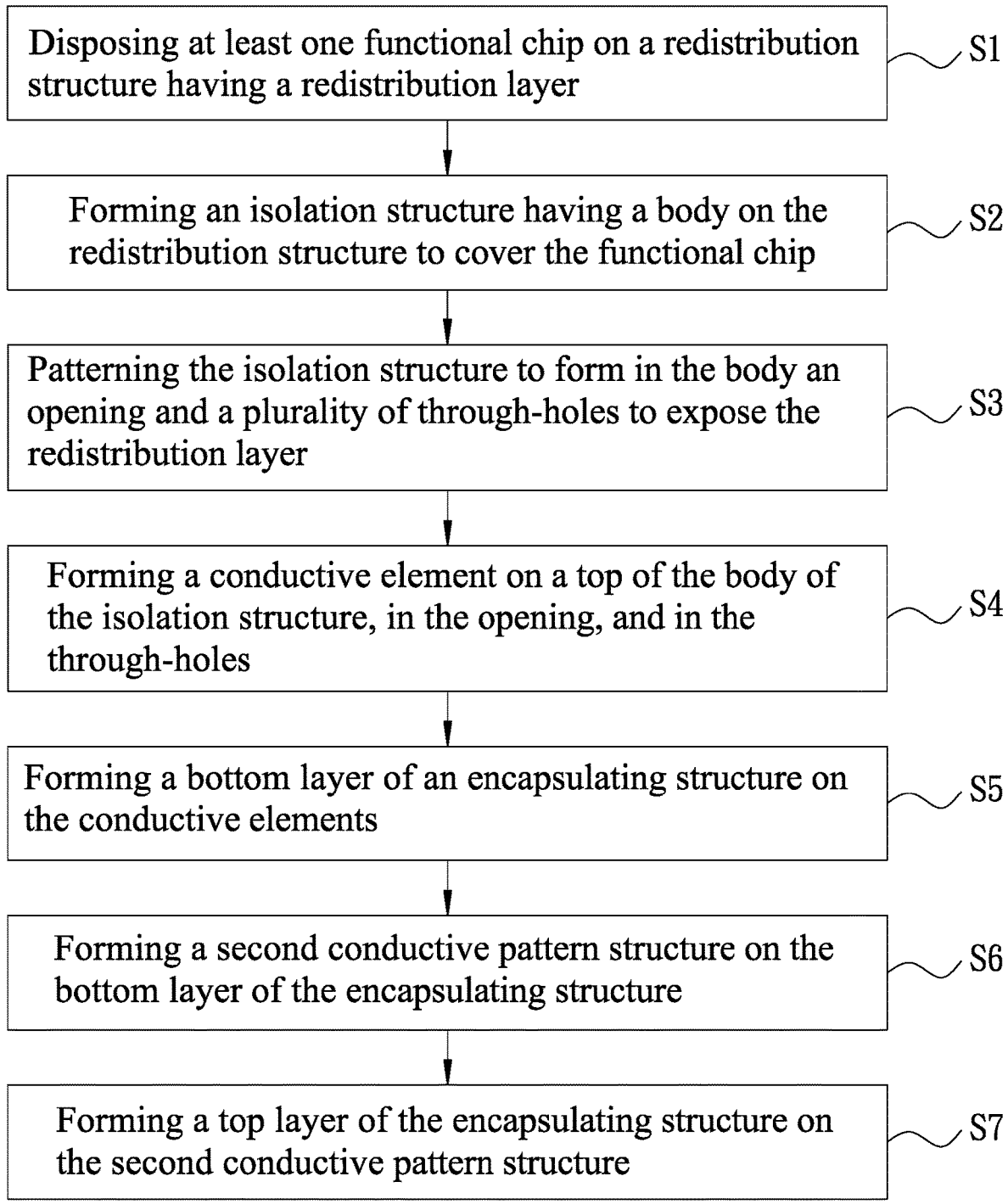
FIG. 2 is a flow diagram illustrating consecutive steps of an embodiment of a method for manufacturing the fan-out semiconductor package in accordance with the disclosure.

A method for manufacturing the embodiment of the abovementioned fan-out semiconductor package includes consecutive steps S1 to S7, as shown in FIG. 2.

Figure 3A:
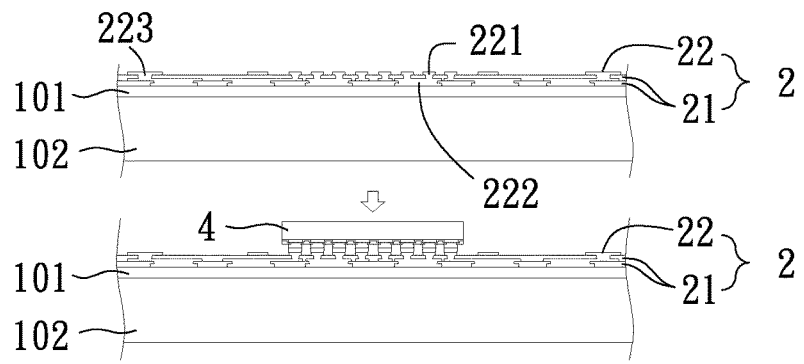
FIGS. 3A to 3G are schematic views illustrating the consecutive steps of the embodiment of the method for manufacturing the fan-out semiconductor package of the disclosure.

In step S1, at least one of the functional chip 4 is disposed on the redistribution structure 2 that has the dielectric layer 21 and the redistribution layer 22 surrounded by the dielectric layer 21. The functional chip 4 is electrically connected to the redistribution layer 22. In some embodiments, a carrier substrate 102 formed with a lift-off layer 101 disposed thereon is provided. Then the dielectric layer 21 and the redistribution layer 22 are formed on the lift-off layer 101 opposite to the carrier substrate 102. Afterwards, the functional chip 4 is bonded to the redistribution layer 22 by flip-chip bonding, as shown in FIG. 3A. Furthermore, there is an interspace formed between the functional chip 4 and the dielectric layer 21, and the interspace may be filled with an underfill material, so that the functional chip 4 can be firmly disposed on the redistribution structure 2.

Figure 3B:
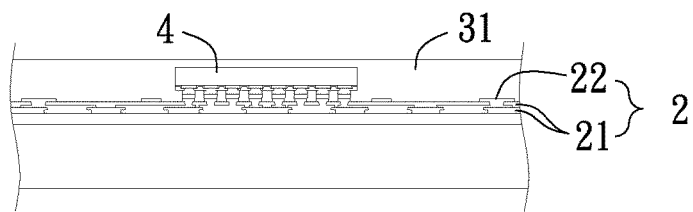

In step S2, the isolation structure 3 having the body 31 is formed on the redistribution structure 2 to cover the functional chip 4, as shown in FIG. 3B. The isolation structure 3 is made of a photosensitive insulating material, such as a photo-sensitive encapsulant.

Figure 3C:
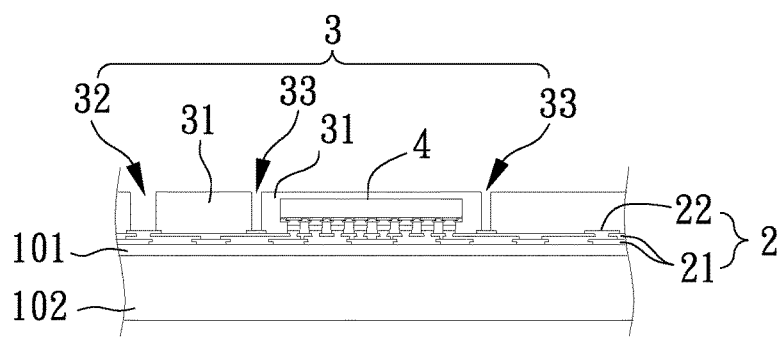
Figure 4:
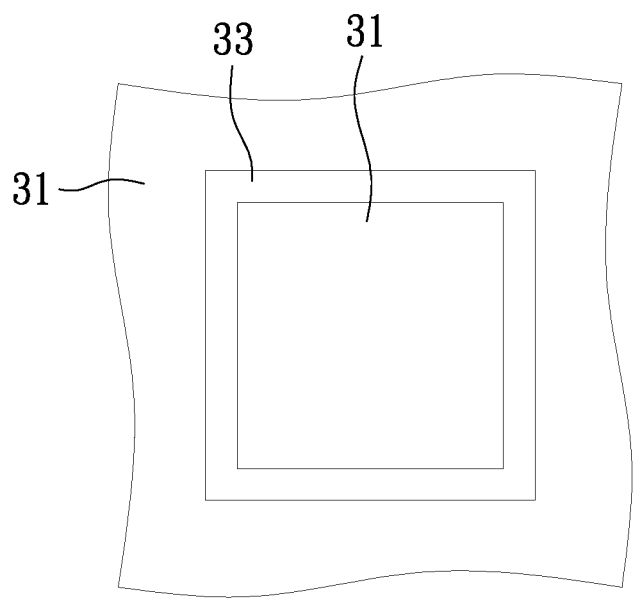
FIG. 4 is a partial top view of an isolation structure of the embodiment of the fan-out semiconductor package of the disclosure.

In step S3, the isolation structure 3 is patterned by photolithography to form in the body 31, an opening 33 that is spaced apart from the functional chip 4 and that surrounds the functional chip 4, and a plurality of through-holes 32 to expose the redistribution layer 22, as shown in FIGS. 3C and 4.

Figure 3D:
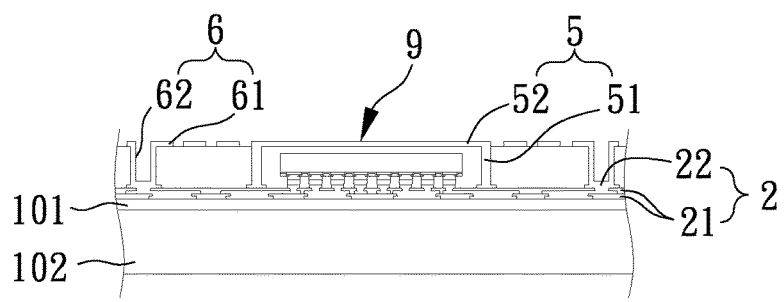

In step S4, a conductive element 9 is formed on the top of the body 31 of the isolation structure 3, in the opening 33, and in the through-holes 32, as shown in FIG. 3D. The conductive element 9 includes the surrounding wall 51, the capping portion 52, the antenna pattern 61, and the conductive feature 62. The surrounding wall 51 is disposed in the opening 33 of the isolation structure 3, and surrounds at least one of the functional chip 4. The capping portion 52 is disposed on the top of the isolation structure 3 and is connected to the surrounding wall 51. The surrounding wall 51 cooperates with the capping portion 52 to form the abovementioned shielding structure 5. The antenna pattern 61 is disposed on the top of the body 31 of the isolation structure 3, and is spaced apart from the capping portion 52. The conductive features 62 is electrically connected to the antenna pattern 61, and extends into each of the through-holes 32 to be electrically connected to the redistribution layer 22. The antenna pattern 61 cooperates with the conductive feature 62 to form the abovementioned first conductive pattern structure 6. The formation of the conductive elements 9 may be carried out by electroplating or conductive paste printing combined with photolithography such that the shielding structure 5 and the first conductive pattern structure 6 may be formed simultaneously, thereby greatly reducing the production cost due to reduction of processing steps.

Figure 3E:
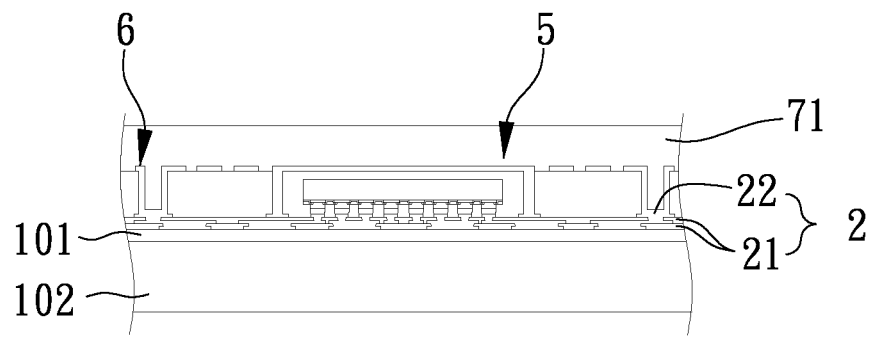
Figure 3F:
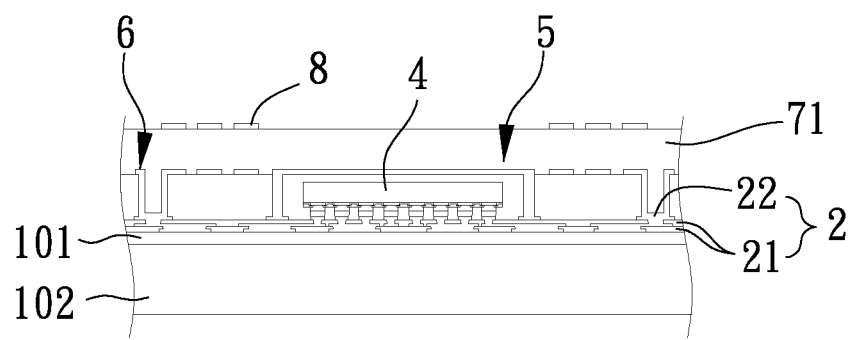

In step S5, the bottom layer 71 of the encapsulating structure 7 is formed on the conductive element 9, that is, the bottom layer 71 covers the shielding structure 5 and the first conductive pattern structure 6, as shown in FIG. 3E. The bottom layer 71 is made from an insulated polymer selected from dry film type insulator (e.g., Ajinomoto build-up film (ABF)), epoxy molding compound, and combinations thereof. The bottom layer 71 may be formed by one of lamination, molding, and a combination thereof. Because operation frequency of the antenna system is a function of a thickness of the bottom layer 71, the thickness of the bottom layer 71 may be adjusted based on the first conductive pattern structure 6 and the second conductive pattern structure 8 to be subsequently formed so as to optimize the operation frequency of the antenna system in the fan-out semiconductor package. Besides, because the encapsulating structure 7 is formed after the formation of the shielding structure 5 that shields the functional chip 4, a volume (i.e., size) of the fan-out semiconductor package is further reduced.

In step S6, the second conductive pattern structure 8 is formed on the bottom layer 71 of the encapsulating structure 7 by one of electroplating combined with photolithography and copper paste printing. The second conductive pattern structure 8 is coupled with the antenna pattern 61 to form the antenna system. Because the second conductive pattern structure 8 is directly disposed on the bottom layer 71 of the encapsulating structure 7, there would be no other components disposed on the bottom layer 71 of the encapsulating structure 7, hence, a shape or size of the second conductive pattern structure 8 may be easily designed and adjusted based on actual specifications of the fan-out semiconductor package of this disclosure to make an operation frequency range of the antenna system more suitable for actual applications.

Figure 3G:
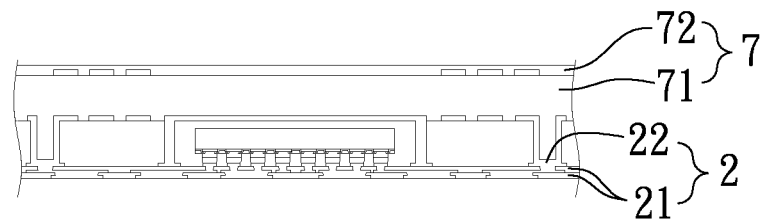

In step S7, the top layer 72 of the encapsulating structure 7 is formed on the second conductive pattern structure 8, as shown in FIG. 3G. The top layer 72 is made from a polymer selected from dry film type insulator (e.g., Ajinomoto build-up film (ABF)), epoxy molding compound, and a combination thereof. The top layer 72 may be formed by one of lamination, coating, printing, and combinations thereof. The top layer 72 cooperates with the bottom layer 71 to enclose and protect the second conductive pattern structure 8 during removal of the lift-off layer 101 and the carrier substrate 102, thereby preventing the second conductive pattern structure 8 from scratching. Besides, the top layer 72 may be made of a black resin that facilitates subsequent marking processes for character recognition. In some embodiments, the lift-off layer 101 and the carrier substrate 102 are removed, and subsequent package sawing is performed so as to obtain the fan-out semiconductor package that can be further integrated with other electronic components.

In summary, the embodiment of the fan-out semiconductor package of the disclosure is developed to fulfill the requirements of millimeter wave signal processing for a 5G mobile telecommunication chip. The method for manufacturing the embodiment of the fan-out semiconductor package is developed to satisfy the requirements of manufacturing antennas with various bandwidths in the fan-out semiconductor package for actual applications.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A fan-out semiconductor package, comprising:
  a redistribution structure for external electrical connection;
  an isolation structure that is disposed on said redistribution structure and that includes a body formed with a plurality of through-holes to expose said redistribution structure;
  a functional chip that is electrically coupled to said redistribution structure;
  a shielding structure that is disposed on said isolation structure and said redistribution structure so as to cooperate with said redistribution structure to enclose said functional chip;
  a first conductive pattern structure that is disposed on said isolation structure and that extends through said through-holes of said isolation structure to be electrically connected to said redistribution structure;
  an encapsulating structure that is disposed on said isolation structure, said shielding structure and said first conductive pattern structure so as to cooperate with said redistribution structure to enclose said isolation structure, said functional chip, said shielding structure and said first conductive pattern structure; and a second conductive pattern structure that is disposed on said encapsulating structure and that is coupled with said first conductive pattern structure to form an antenna system, wherein said shielding structure is made of a conductive material and includes a surrounding wall disposed in said body of said isolation structure and a capping portion that is connected to said surrounding wall and that is disposed on a top of said body of said isolation structure, said surrounding wall and said capping portion cooperatively defining an inner space for receiving said functional chip.

2. The fan-out semiconductor package of claim 1, wherein said redistribution structure includes a dielectric layer and a redistribution layer disposed on said dielectric layer to be electrically connected to said functional chip and the external electrical connection.

3. The fan-out semiconductor package of claim 2, wherein said isolation structure is made of a photosensitive insulating material, said body being disposed on said dielectric layer to cover said functional chip, said through-holes extending through said body to expose said redistribution layer.

4. The fan-out semiconductor package of claim 2, wherein said first conductive structure includes an antenna pattern that is disposed on the top of said body of said isolation structure and a conductive feature that is electrically connected to said antenna pattern and that extends along a sidewall of each of said through-holes to be electrically connected to said redistribution layer.

5. The fan-out semiconductor package of claim 4, wherein said encapsulating structure includes a bottom layer covering said isolation structure, said shielding structure and said first conductive pattern structure, and a top layer disposed on said bottom layer opposite to said redistribution structure, said second conductive pattern structure being disposed between said bottom layer and said top layer.

6. A method for manufacturing a fan-out semiconductor package, comprising:

providing a redistribution structure for external electrical connection, the redistribution structure having a redistribution layer;

disposing a functional chip on the redistribution structure, the functional chip being electrically coupled to the redistribution structure;

forming an isolation structure on the redistribution structure to cover the functional chip, the isolation structure being made of a photosensitive insulating material and having a body;

patterning the isolation structure to form in the body an opening that is spaced apart from the functional chip and that surrounds the functional chip, and a plurality of through-holes to expose the redistribution structure;

forming a conductive element which includes a shielding structure disposed on the isolation structure and the redistribution structure so as to cooperate with the redistribution structure to enclose the functional chip, the shielding structure being made of a conductive material and including a surrounding wall that is disposed in the opening of the body of the isolation structure, and a capping portion that is disposed on a top of the body of the isolation structure and that is connected to the surrounding wall, the surrounding wall and the capping portion cooperatively defining an inner space for receiving the functional chip, and a first conductive pattern structure including an antenna pattern that is disposed on the top of the body of the isolation structure and that is spaced apart from the capping portion, and a conductive feature that is electrically connected to the antenna pattern and that extends through the through-holes to be electrically connected to the redistribution structure;

forming a lower encapsulating structure on the isolation structure, the shielding structure and the first conductive pattern structure so as to cooperate with the redistribution structure to enclose the isolation structure, the functional chip, the shielding structure and the first conductive pattern structure, the lower encapsulating structure being made of a polymer material;

forming a second conductive pattern structure on the lower encapsulating structure so as to be coupled with the first conductive pattern structure to form an antenna system; and forming an upper encapsulating structure on the second conductive pattern structure, the upper encapsulating structure being made of a polymer material.

7. The method of claim 6, wherein the lower encapsulating structure has a thickness that is a function of an operation frequency of the antenna system.

8. The method of claim 6, further comprising disposing a carrier substrate on the redistribution structure in position opposite to the functional chip.

9. The method of claim 8, wherein the redistribution structure further has a dielectric layer that is disposed on the carrier substrate and that surrounds the redistribution layer, the dielectric layer being made of a dielectric material, the redistribution layer being made of a metallic material, the functional chip being electrically connected to the redistribution layer by flip-chip bonding.

10. The method of claim 6, wherein the photosensitive insulating material includes a photo-sensitive encapsulant.

11. The method of claim 6, wherein the lower encapsulating structure is made of the polymer material selected from one of epoxy molding compound, Ajinomoto build-up film (ABF), and a combination thereof, the lower encapsulating structure being formed by one of lamination, molding, and a combination thereof.

12. The method of claim 6, wherein the upper encapsulating structure is made of the polymer material selected from one of epoxy molding compound, Ajinomoto build-up film (ABF), and a combination thereof, the upper encapsulating structure being formed by one of lamination, coating, printing, and combinations thereof.

* * * * *